United States Patent
Patino et al.

(10) Patent No.: US 7,167,107 B2
(45) Date of Patent: Jan. 23, 2007

(54) KEYPAD ARRAY HAVING REDUCED NUMBER OF INPUT/OUTPUTS AND METHOD FOR GENERATING SAME

(75) Inventors: Joseph Patino, Pembroke Pines, FL (US); Russell L. Simpson, Miami, FL (US)

(73) Assignee: Motorola, Inc., Schaumburg, IL (US)

( * ) Notice: Subject to any disclaimer, the term of this patent is extended or adjusted under 35 U.S.C. 154(b) by 379 days.

(21) Appl. No.: 10/667,269

(22) Filed: Sep. 19, 2003

(65) Prior Publication Data
US 2005/0062618 A1 Mar. 24, 2005

(51) Int. Cl.
*H03M 11/00* (2006.01)
*H03K 17/94* (2006.01)
*G08C 19/00* (2006.01)

(52) U.S. Cl. .............................. 341/22; 341/21; 341/23; 341/24; 341/25; 341/26; 341/34; 340/825.78

(58) Field of Classification Search ................. 341/22, 341/26, 21, 23, 24, 25, 34; 340/825.79, 825.87, 340/825.78; 364/909.01; 400/472; 345/168; 378/369
See application file for complete search history.

(56) References Cited

U.S. PATENT DOCUMENTS

| 4,357,496 | A |  | 11/1982 | Nahas |  |
|---|---|---|---|---|---|
| 5,783,874 | A |  | 7/1998 | Gaglione et al. |  |
| 5,929,790 | A | * | 7/1999 | Lim | 341/22 |
| 6,326,906 | B1 | * | 12/2001 | Thus | 341/26 |
| 6,424,274 | B1 | * | 7/2002 | Schnizlein et al. | 341/26 |
| 6,563,434 | B1 |  | 5/2003 | Olodort et al. |  |

OTHER PUBLICATIONS http://www.geocities.com/andrewmuch/LCD.htm, Sep. 19, 2003.

* cited by examiner

*Primary Examiner*—Jeffery Hofsass
*Assistant Examiner*—Sisay Yacob
(74) *Attorney, Agent, or Firm*—Larry G. Brown

(57) ABSTRACT

The invention concerns a method (200) of generating an array (100, 300, 400) having a reduced number of input/outputs (114, 314, 414). The method includes the steps of, for each array row input/output, grouping (212) at least one set of rows (124, 324, 424) in which the set of rows is coupled to the array row input/output and, for each combination of the array row input/outputs, selectively coupling (216) non-set rows (326, 426) to the array row input/outputs that comprise the combination. At least a portion of a number of rows (110, 310, 410) for the array is equal to the number of rows in each set of rows multiplied by the number of array row input/outputs plus the number of non-set rows coupled to the array row input/output combinations.

14 Claims, 4 Drawing Sheets

KEYPAD ARRAY HAVING REDUCED NUMBER OF INPUT/OUTPUTS AND METHOD FOR GENERATING SAME

BACKGROUND

1. Technical Field

This invention relates in general to keypad arrays and more particularly, to the reduction of input/outputs of such arrays.

2. Description of the Related Art

Many electronic devices include keypads for permitting users to enter alphanumeric symbols into the device. For example, almost all mobile communications units include a keypad having a plurality of keys in which the user of the mobile unit can dial numbers or enter text through selective pressing of the keys. The keys in a typical keypad are positioned such that they form an array having a number of columns and rows. As an example, many keypads have three columns and four rows, and this particular configuration is commonly referred to as a 3×4 array. Other designs are possible, such as 3×5, 4×5 and 6×5 arrays.

The devices that include these keypads have some type of processor to receive and process signals from the keys. In response to the receipt of these signals, the processor will perform some function or operation, which reflects the user's sequence of pressing the keys. Currently, in interrupt-driven systems, the processor has an input/output (I/O) for each of the columns and rows that make up the keypad array of the device. For example, in a 3×4 array, the processor will have an I/O for each of the columns (three of them) and each of the rows (four of them) for a total of seven I/Os. This one-to-one correspondence is inefficient and consumes a significant amount of processor I/Os, particularly if the number of keys in an array increases. As an example, the implementation of a 4×10 array, which contains 40 keys, requires fourteen processor I/Os. This inefficient consumption of processor I/Os is likely to continue in the future due to the expansion of the number of keys on electronic devices. Thus, what is needed is a method and system for reducing the number of I/Os for a particular keypad array.

SUMMARY OF THE INVENTION

The present invention concerns a method of generating an array having a reduced number of input/outputs. The method includes the steps of, for each array row input/output, grouping at least one set of rows in which the set of rows is coupled to the array row input/output and, for each combination of the array row input/outputs, selectively coupling non-set rows to the array row input/outputs that comprise the combination. At least a portion of a number of rows for the array is equal to the number of rows in each set of rows multiplied by the number of input/outputs coupled to the array row input/outputs plus the number of non-set rows coupled to the array input/output combinations.

In one arrangement, each set of rows can include a first row and a second row. Additionally, the method can further include the step of positioning at least one passive element between the second row and the array row input/output. The method can also include the step of positioning a passive element between each non-set row and each of the array row input/outputs that comprise the combination. As an example, the passive element for either step can be a diode.

In another arrangement, the array can further have a number of keys, switches and columns, and the keys can be coupled to the switches. Also, the switches can be coupled to the rows in the set of rows, the non-set rows and columns. In response to at least one of the keys being activated, the method can further include the step of selectively transitioning the rows in the set of rows and the non-set rows between low and high states and the columns between low and high input states to determine which key has been activated.

The present invention also concerns an array having a reduced number of input/outputs. The array includes at least one column and at least one set of rows for each array row input/output. The set of rows are coupled to the array row input/outputs, and a predetermined number of the array row input/outputs form combinations. If non-set rows are added to the array, the non-set rows are coupled to the array row input/outputs that comprise the combinations. In addition, at least a portion of a number of rows for the array is equal to the number of rows in each set of rows multiplied by the number of array row input/outputs plus the number of non-set rows coupled to the array row input/output combinations. The system can further include suitable software and circuitry for implementing the method described above.

BRIEF DESCRIPTION OF THE DRAWINGS

The features of the present invention, which are believed to be novel, are set forth with particularity in the appended claims. The invention, together with further objects and advantages thereof, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
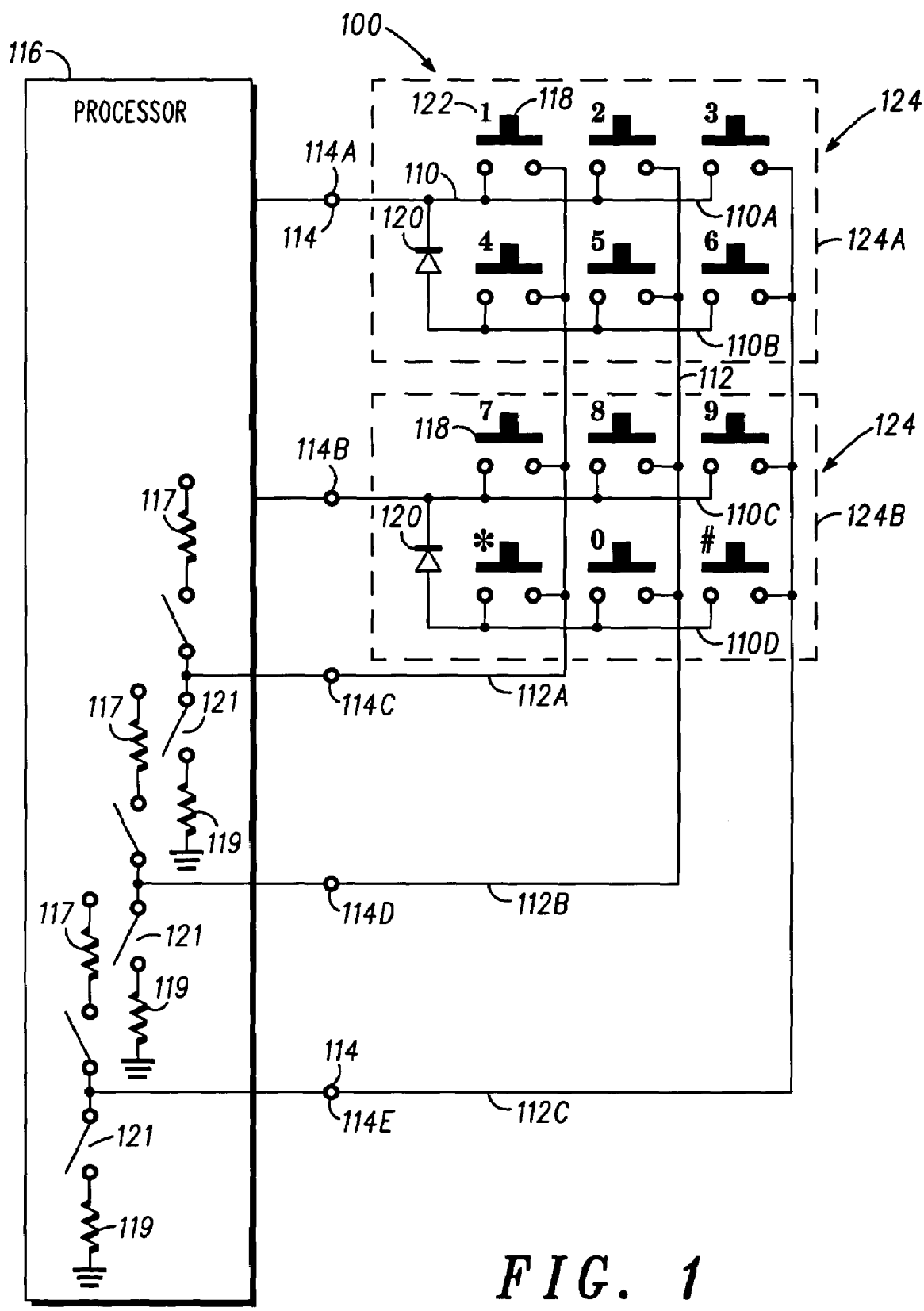
FIG. 1 illustrates a keypad array in accordance with the inventive arrangements.

While the specification concludes with claims defining the features of the invention that are regarded as novel, it is believed that the invention will be better understood from a consideration of the following description in conjunction with the drawing figures, in which like reference numerals are carried forward.

Referring to FIG. 1, an example of an array 100 having a reduced number of I/Os is shown. In one arrangement, the array 100 can be part of an interrupt-driven keypad system, although the invention is not so limited, as the array 100 can be incorporated in any other suitable system. The array 100 can also be part of any suitable electronic device that includes a keypad. The array 100 can have a number of rows 110 and a number of columns 112. The individual rows 110 and columns 112 have reference letters attached to their numerical designations for purposes of explaining the operation of the invention. In this example, the array 100 can include rows 110A, 110B, 110C and 110D and columns 112A, 112B and 112C. The number of rows 110 and columns 112 can determine the configuration of the array 100. As an example, the array 100 in FIG. 1 can be referred to as a 3×4 array. Of course, this particular array 100 is merely meant to illustrate the inventive arrangements, as the invention contemplates arrays with other suitable configurations, some of which will be presented below.

The array 100 can have a number of I/Os 114. The I/Os 114 also have reference letters attached to their numerical designations to individually identify them. These I/Os 114 can be coupled to the rows 110 and the columns 112. For example, an I/O 114A can be coupled to the rows 110A and 110B, and an I/O 114B can be coupled to the rows 110C and 110D. In addition, an I/O 114C can be coupled to the column 112A, an I/O 114D can be coupled to the column 112B and an I/O 114E can be coupled to the column 112C. The I/Os 114 that are coupled to the rows 110 can be referred to as row I/Os, and the I/Os that are coupled to the columns can be referred to as column I/Os.

Each of the I/Os 114A–E can be coupled to a processor 116. The processor 116 can, for example, transition the rows 110A and 110B between low and high states. Moreover, the processor 116 can include one or more pull-up resistors 117 and one or more pull-down resistors 119. The I/Os 114C–E can be coupled to the pull-up resistors 117 and the pull-down resistors 119 through one or more switches 121, each of which can be under the control of the processor 116. The pull-down resistors 119 can be higher in value than the pull-up resistors 119. Through selective closing of the switches 121, the processor 116 can transition the I/Os 114C–E between input high and input low states. For an input high state, the processor 116 can close the switch 121 that causes the relevant pull-up resistor 117 to be switched into the circuit and the relevant pull-down resistor 119 to be switched out. Alternatively, for an input low state, the processor 116 can close the switch 121 that causes the relevant pull-down resistor 119 to be switched into the circuit and the relevant pull-up resistor 117 to be switched out.

The array 100 can also have a number of switches 118, which can be coupled to the rows 110A–D and the columns 112A–C. In one arrangement, the switches 118 can be associated with or correspond to a number of keys 122. When a user presses one of the keys 122, the switch 118 associated with that key 122 can close, which, as will be explained below, permits the processor 116 to determine which key 122 was pressed. It is important to note that the invention is not limited to the particular arrangement of keys 122 as shown in FIG. 1, as the array 100 can contain any suitable number of keys 122, which can be designated with any suitable symbol.

In one arrangement, the array 100 can include a number of passive elements 120. As an example, the passive element 120 can be a diode. The passive element 120 can be used to couple rows 110 to one another. For example, the passive element 120 can be used to couple the row 110A to the row 110B. This configuration can reduce the overall number of I/Os 114 in the array 100. For example, in prior art systems, the array 100 would require at least seven I/Os 114. Here, however, the array 100 only has five I/Os, I/Os 114A–E.

The rows 110 can form one or more sets of rows 124. The sets of rows 124 will also have reference letters attached to their numerical designations to help identify them individually. In one arrangement and without limitation, the array 100 can include a set of rows 124 for each I/O 114, and the set of rows 124 can include two rows 110—a first row 110 and a second row 110. For example, the array 100 shown in FIG. 1 can contain two sets of rows 124A, 124B in which the set of rows 124A can include the rows 110A, 110B, and the set of rows 124B can include the rows 110C, 110D. Further, the rows 110A and 110C can be referred to as first rows 110, and the rows 110B and 110D can be referred to as second rows 110. It is understood, however, that the invention is not limited in this regard, as the array 100 can include any suitable number of sets of rows 124 having any suitable number of rows 110.

The operation of the array 100 will now be discussed. Prior to a key 122 being pressed, the processor 116 can set to a low state the I/Os 114A and 114B. Additionally, the processor 116 can set to an input high state the I/Os 114C, 114D and 114E. In operation, a user can press one of the keys 122. Pressing the key 122 can cause the switch 118 associated with the key 122 to close, which can cause one of the columns 112 to transition from high to low. This transition can cause an interrupt signal to be generated, which the processor 116 can detect.

To describe the invention, an example will be presented in which the user presses the key 122 that is associated with the number 5, i.e., the key 122 that is at the intersection of the row 110B and the column 112B. Of course, this description is merely an example, as the overall operation and principles to be shown here apply to the remaining keys 122 or keys 122 in a different array as well.

In response to the key 122 being pressed, the processor 116 can set I/Os 114A and 114B low and can set I/Os 114C, 114D and 114E to an input high state. The processor 116 can then determine which column 112 is low due to the switch 118 being closed. In this particular example, the column 112B will be low. Next, to determine which key 122 in the column 112B was pressed, the processor 116 can set the I/O 114A high while keeping the I/O 114B low. The processor 116 can then determine the state of the I/O 114D. If it is low, then the processor 116 can determine that the key 122 that was pressed is either the key 122 associated with the number 8 or the key 122 associated with the number 0.

In this example, because the key 122 associated with the number 5 was pressed, the I/O 114D will be high. As a result, the processor 116 will narrow its focus on the keys 122 associated with the number 5 and the number 2 as it attempts to determine which key 122 was pressed. To determine which of these keys 122 was pressed, the processor 116 can set the I/O 114D to an input low state by switching in the appropriate pull-down resistor 119. As I/O 114A can remain high, the I/O 114D can remain at an input high if the key 122 associated with the number 2 was pressed. Conversely, if the key 122 associate with the number 5 was pressed, the I/O 114D will be at a low input state in view of the passive element 120 and because the pull-down resistor 119 is a weak pull-down. Thus, the processor 116 can determine that the key 122 associated with the number 5 was pressed. A similar process can be performed in response to any of the other keys 118 being pressed. It is understood, however, that the invention is in no way limited to this particular operation, as other sequences can be followed for purposes of identifying which key 122 in the array 100 or any other suitable array has been pressed.

Figure 2:
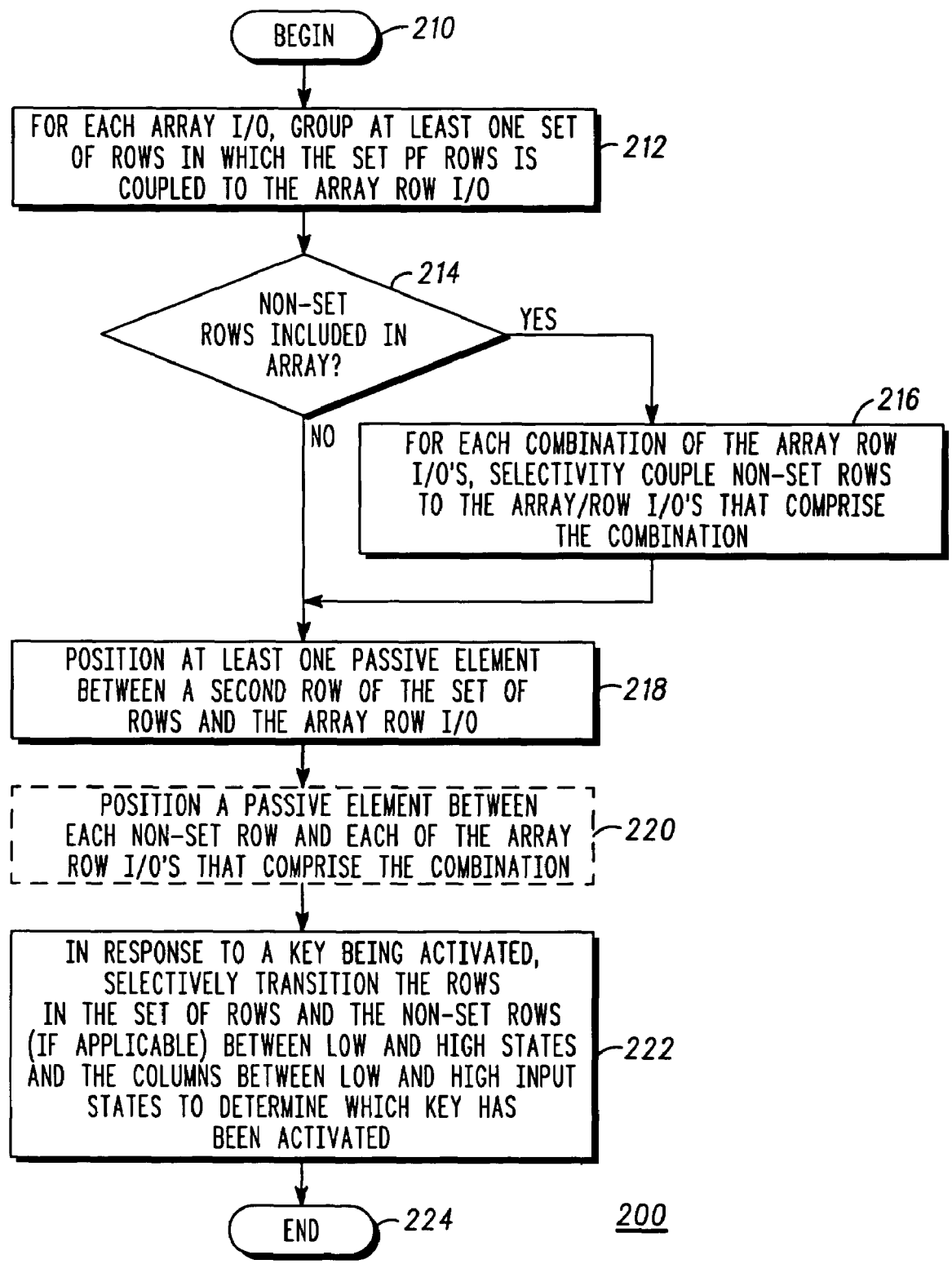
FIG. 2 illustrates a method for reducing the number of I/Os of a processor for a given keypad array in accordance with the inventive arrangements.
Figure 3:
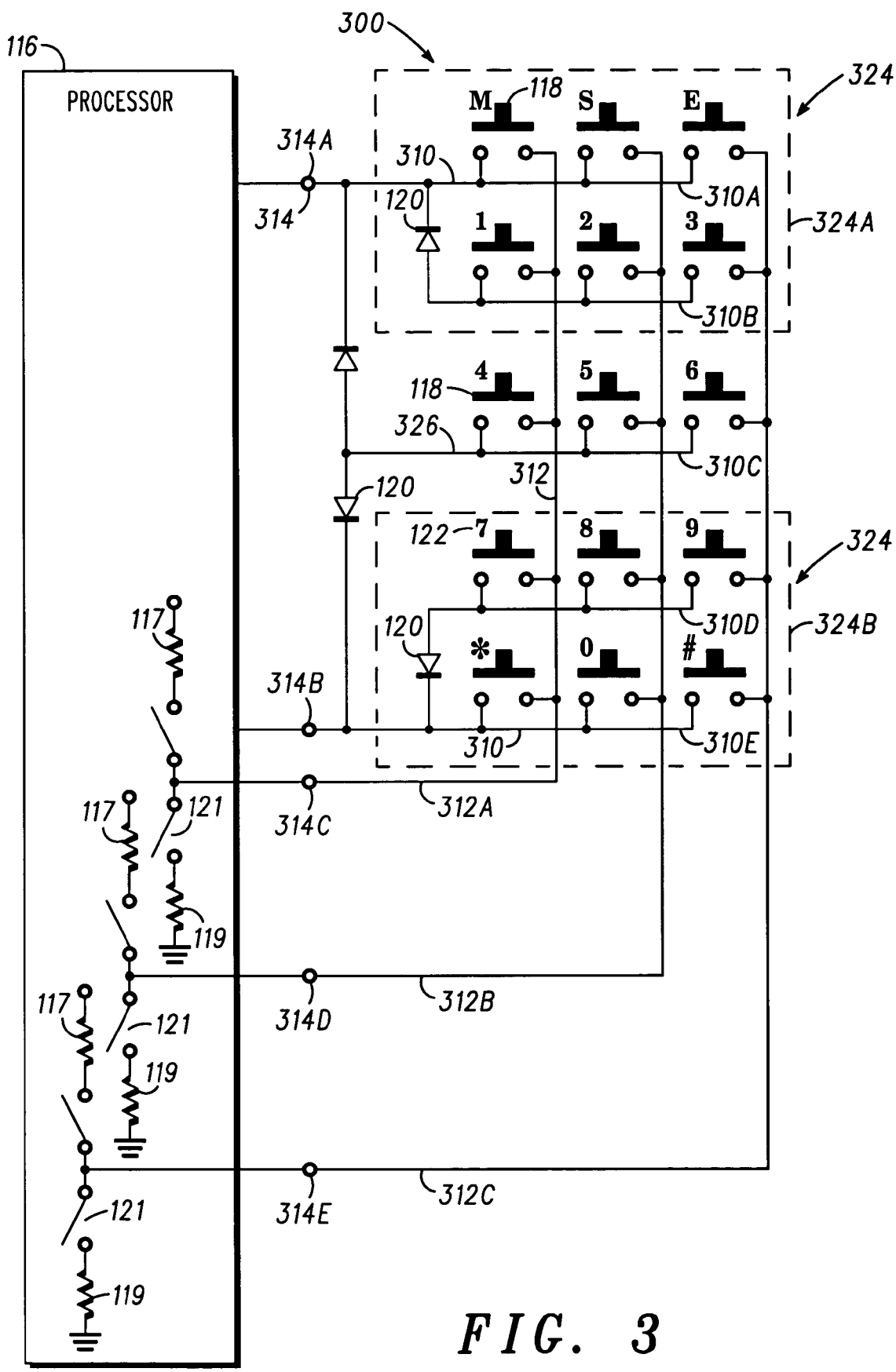
FIG. 3 illustrates another keypad array in accordance with the inventive arrangements.
Figure 4:
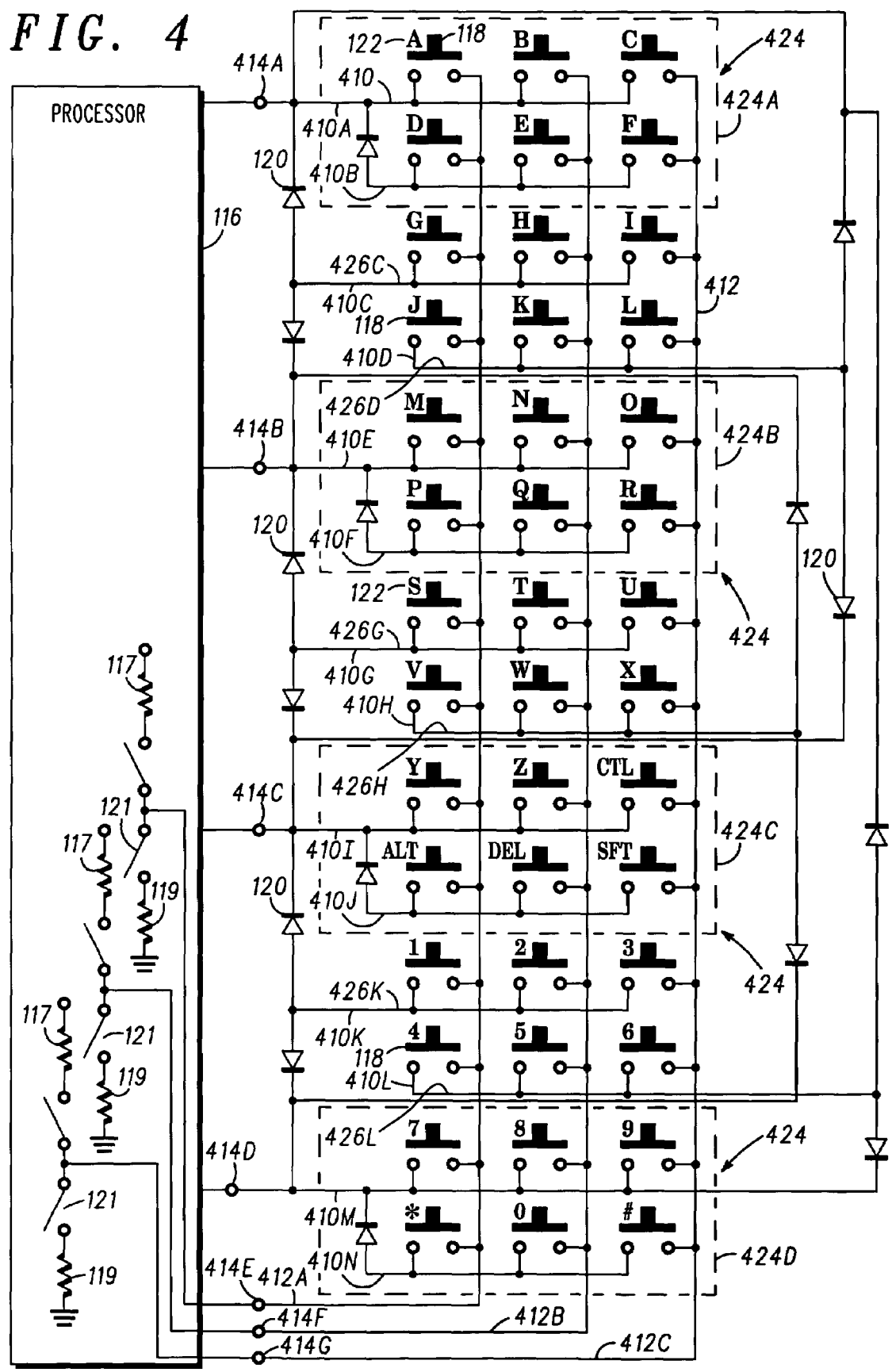
FIG. 4 illustrates yet another keypad array in accordance with the inventive arrangements.

As noted earlier, the passive elements 120 can lower the overall number of I/Os 114 necessary for operation of the array 100. As also explained above, the invention is not limited to the array 100 of FIG. 1. Referring to FIG. 2, a flowchart illustrates a method 200 for generating any array having a reduced number of I/Os. To describe this method 200, reference will be made to FIGS. 1, 3 and 4. Several different arrays, each of which contain a greater number of keys 122 than in the array 100 of FIG. 1, are shown in FIGS. 3 and 4. An array 300 having rows 310A–E and columns 312A–C is shown in FIG. 3, and an array 400 having rows 410A–N and columns 412A–C is shown in FIG. 4. It must be noted, however, that the invention is in no way limited to either of the arrays shown in FIGS. 1, 3 or 4.

Referring to FIG. 2, at step 210, the method 200 can begin. At step 212, for each array row I/O, at least one set of rows can be grouped in which the set of rows can be coupled to the array row I/O. For example, in array 100 of FIG. 1, for the row I/O 114A, the rows 110A and 110B can be grouped to form a set of rows 124A, and this set of rows 124A can be coupled to the row I/O 114A. Similarly, for the row I/O 114B, the rows 110C and 110D can be grouped to from the set of rows 124B. Referring to FIG. 3, for the row I/O 314A, rows 310A and 310B can be grouped to form a set of rows 324A, and for the row I/O 314B, the rows 310D and 310E can be grouped to form a set of rows 324B. Referring to FIG. 4, the rows 410 can be grouped in accordance with the following configuration: (1) for the row I/O 414A, the rows 410A and 410B can be grouped to form the set of rows 424A; (2) for the row I/O 414B, the rows 410E and 410F can be grouped to form the set of rows 424B; (3) for the row I/O 414C, the rows 410I and 410J can be grouped to form the set of rows 424C; and (4) for the row I/O 414D, the rows 410M and 410N can be grouped to form the set of rows 424D.

At decision block 214, it can be determined whether non-set rows are to be included in the array. If not, the method 200 can continue at step 218. If yes, then for each combination of the array row I/Os, the non-set rows can be selectively coupled to the array row I/Os that make up the combination, as shown at step 216. For example, referring to FIG. 3, the array 300, as explained above, can include two sets of rows 324A, 324B, which respectively contain the rows 310A, 310B and the rows 310D, 310E. The row 310C, however, is not part of either of the sets of rows 324, and it can be referred to as a non-set row 326. Thus, a non-set row 326 can be any row 110, 310, 410 that is not part of a set of rows 124, 324 or 424 (see FIG. 4). As an example, the array 100 in FIG. 1 has no non-set rows, the array 300 in FIG. 3 has one non-set row 326, and the array 400 in FIG. 4 has six non-set rows 426. Adding non-set rows 326, 426 can increase the number of keys 122 in an array.

The non-set rows 326, 426 can be coupled to combinations of row I/Os 314, 414. For example, referring to FIG. 3, there are two row I/Os 314A and 314B, and these I/Os form one combination. In accordance with the inventive arrangements, the non-set row 326 can be coupled to the row I/Os 314 that make up this combination, namely row I/O 314A and I/O 314B. Referring to FIG. 4, there are four row I/Os 414A, 414B, 414C and 414D, and these I/Os can form six combinations: (1) I/O 414A, I/O 414B; (2) I/O 414A, I/O 414C; (3) I/O 414A, I/O 414D; (4) I/O 414(B), I/O 414(C); (5) I/O 414(B), I/O 414(D); and (6) I/O 414(C), I/O 414(D).

Here, the non-set rows 426 can be selectively coupled to the row I/Os 414 that make up these combinations (the non-set rows 426 also have letter designations to assist in the explanation of the operation of the array 400). As an example, the non-set row 426C can be coupled to the I/O 414A and the I/O 414B, the I/Os 414 that comprise the first combination described above. As another example, the non-set row 426K can be coupled to the I/O 414C and the I/O 414D. As shown, a similar process can be carried out for the other non-set rows 426D, 426G, 426H and 426L. It is understood, however, that the invention is not limited to this particular configuration, as the non-set rows 326, 426 can be coupled to the I/Os 314, 414 that make up the different combinations in accordance with other suitable arrangements.

Referring back to FIG. 2, at step 218, at least one passive element can be positioned between the second row of a set of rows and the array row I/Os. For example, referring to FIG. 1, a passive element 120 can be positioned between the second row 110B and the row I/O 114A. This process can also be repeated for the other second row 110D. Referring to FIG. 3, a passive element 120 can be positioned between the second rows 310B and 310D and the respective I/Os 314 to which they are coupled, the row I/O 314A and the row I/O 314B. Similarly, referring to FIG. 4, a passive element 120 can be positioned between the second rows 410B, 410F, 410J and 410N and the respective row I/Os 414 to which they are coupled, I/O 414A, I/0 414B, I/0 414C and I/O 414D.

Referring back to FIG. 2, at step 220, a passive element can also be positioned between each non-set row and each of the array row I/Os that comprise a combination. Because not all arrays may have non-set rows, e.g., array 100 in FIG. 1, step 220 is shown with a dashed outline, which indicates that it may not apply to a particular array. Referring to FIG. 3, as an example, a passive element 120 can be positioned between the non-set row 326 and both the row I/Os 314 that make up the combination of array row I/Os, I/O 314A and I/O 314B. Referring to FIG. 4, as another example, a passive element 120 can be positioned between the non-set row 426C and the row I/O 414A and the row I/O 414B, which comprise the first combination listed above. This process can be performed for the remaining non-set rows 426D, 426G, 426H, 426K and 426L of the array 400.

Positioning the passive elements 120 between the row I/Os 114, 314 and 414 and the rows 110, 310, 410 and the non-set rows 326, 426 can reduce the number of I/Os required for each array. As explained earlier, the array 100 of FIG. 1 has only five I/Os 114, as opposed to seven I/Os in a conventional array. Moreover, the array 300 of FIG. 3 only has five I/Os 314, which is three fewer than the number of I/Os required in a conventional array. Finally, the array 400 of FIG. 4 only has seven I/Os 414. A conventional array with the same number of keys 118 would require seventeen I/Os.

In accordance with the above discussion, at least a portion of the number of rows for an array can be equal to the number of rows in each set of rows multiplied by the number of row I/Os of the array plus the number of non-set rows coupled to the combinations of row I/Os of the array. Specifically, for a given number of row I/Os:

$$N_{RA} = (N_{RS} \times N_{RI/O}) + N_{NSR},$$

where:

$N_{RA}$ is the number of rows for the array;

$N_{RS}$ is the number of rows in each set of rows;

$N_{RI/O}$ is the number of row I/Os in the array; and $N_{NSR}$ is the number of non-set rows coupled to the combinations of row I/Os of the array.

For example, referring to FIG. 1, there are two rows 110 in each set of rows 124, and there are two row I/Os in the array 100, I/O 110A and I/O 110B. There are no non-set rows, however. Thus, for a given number of two row I/Os 110, the number of rows 110 in the array 100 can be four. As another example, referring to FIG. 3, there are two rows 310 in each set of rows 324, two row I/Os 314 and one non-set row 326. Accordingly, for a given number of two row I/Os 314, the number of rows 310 can be five rows 310 for the array 300. As yet another example, referring once again to FIG. 4, there are two rows 410 in each set of rows 424, there are four row I/Os 414 and there are six non-set rows 426. As a result, for a given number of four row I/Os 414, the number of rows 410 for the array 400 can be fourteen.

In each of these examples, for a given number of row I/Os, the array can have a greater number of rows than the number found in conventional arrays having the same number of row I/Os. Hence, a large number of keys can be incorporated into an array without requiring an equally large number of I/Os. In fact, as the number of keys increases, the reduction in I/Os becomes even more notable. It is understood, however, that the invention is in now way limited to these particular examples, as the method 200 can be used to produce other suitable arrays. Moreover, additional rows can be added to an array through conventional means if desired, i.e., a row can be added and coupled directly to an I/O. Further, any suitable number of columns can be added to the array.

Referring back to FIG. 2, at step 222, in response to a key being activated, the rows in the set of rows and the non-set rows (if applicable) can be transitioned between low and high states and the columns between input high and input low states to determine which key has been activated. The term "activated" can include any operation or process in which one of the keys 122 is manipulated to cause its associated switch 118 to close. Although primarily presented as a pressing or touching force, the invention is not limited in this regard. An example of this transitioning process has been discussed above in relation to FIG. 1. Nonetheless, examples of this operation will be described with respect to the arrays 300, 400 in FIGS. 3 and 4, respectively.

Referring to FIG. 3, an example will be presented in which the key 122 associated with the number 5 is pressed. This key 122 can be associated with the switch 118 at the intersection of the row 310C and the column 312B. Similar to the process described in relation to FIG. 1, an interrupt signal can be generated, and the processor 116 can set the I/Os 314A and 314B low and can set the I/Os 314C, 314D and 314E at input high states. Because the switch 118 at the intersection of the row 310C and the column 312B is closed, the I/O 314D can be pulled low, and the processor 116 can determine that the key 122 that was activated is in the column 112B.

The processor 116 can then set the I/O 314A high (the I/O 314B can remain low). Because the row 310C is coupled to the I/O 314B, the I/O 314D will stay low. The processor 116 can now set the I/O 314A low and the I/O 314B high. The I/O 314D will remain low because the row 310C is also coupled to the I/O 314A. At this point, the processor 116 can determine that the key 122 associated with the number five was activated because the row 310C is the only row 310 coupled to both the I/Os 314A and 314B. A similar process can be performed for any of the other keys 122 in the array 300. It is understood that to distinguish between the keys 122 in the rows 310A, 310B, 310D and 310E, the processor 116 can transition the I/Os 314C–E from an input high state to an input low state in a process similar to that described in relation to the array 100 of FIG. 1.

Referring to FIG. 4, an example will be presented in which the key 122 associated with the letter "W" will be activated. An interrupt signal can be generated, and the processor 116 can set the row I/Os 414A, 414B, 414C and 414D low and can set the I/Os 414E, 414F and 414G to input high. Because the key 122 associated with the letter W was activated and the associated switch 118 closed, the column 412B can be pulled low, and the processor 116 can determine that the key 122 that was activated is in the column 412B.

In one arrangement, the processor 116 can then set the row I/O 414A high and the remaining row I/Os, 414B–414D, can stay low. Because the switch 118 corresponding to the key 122 associated with the letter W is closed, the I/O 414F is low. The processor 116 can then determine that the keys 122 associated with the letters "B" and "E" were not pressed. In another arrangement, the processor 116 can keep the row I/O 414A high and can set the row I/O 414B high. Because the I/O 414F stays low, the processor 116 can determine that the keys 122 associated with the letters "N," "H" and "Q" were not pressed.

Continuing with the example, the processor 116 can also set the I/O 414C high (I/Os 414A and 414B can remain high). Again, the I/O 414F will remain low, and the processor 116 can determine that the keys 122 associated with the letters "K," "T" and "Z" and the symbol "DEL" were not pressed. At this point, the processor 116 can ascertain that the key 122 that was activated is coupled to the row I/O 414D.

In response, and as an example, the processor 116 can set the row I/O 414A low and can set the row I/Os 414B–D high. Here, the I/O 414F can be pulled high. As a result, the processor 116 can eliminate the key 122 associated with the number "5." In another arrangement, the processor 116 can then set the row I/Os 414A and 4141B low and can keep the row I/Os 414C and 414D set high. The I/O 414F will be pulled low, and the processor 116 can then determine that the keys 122 associated with the numbers "2," "8" and "0" were not pressed. Through the process of elimination, the processor 116 can determine that the key 122 associated with the letter "W" was pressed.

The above-described operation can be performed for any of the other keys 122 in the array 400. As those of ordinary skill in the art will appreciate, to distinguish between the rows 410 that comprise each of the set of rows 424, the processor 116 can transition the I/Os 414E–G from an input high state to an input low state. An example of this process was presented in accordance with the description of the operation of the array 100 of FIG. 1.

It is understood that the invention is in no way limited to the sequence of transitioning from low to high states (and vice versa) presented above, as any suitable sequence can be used to determine which key 122 has been activated. It must also be stressed that the invention is not limited to any of the arrays described herein, as any other suitable array can be produced and operated in accordance with the inventive arrangements.

In addition, while the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of generating an array having a reduced number of input/outputs, comprising the steps of;
   for each array row input/output, grouping at least one set of rows in which the set of rows is coupled to the array row input/output; and
   for each combination of the array row input/outputs, selectively coupling non-set rows to the array row input/outputs that comprise the combination;
   wherein at least a portion of a number of rows for the array is equal to the number of rows in each set of rows multiplied by the number of input/outputs coupled to the array row input/outputs plus the number of non-set rows coupled to the array input/output combinations.

2. The method according to claim 1, wherein each set of rows includes a first row and a second row and said method further comprises the step of positioning at least one passive element between the second row and the array row input/output.

3. The method according to claim 2, wherein the passive element is a diode.

4. The method according to claim 1, further comprising the step of positioning a passive element between each non-set row and each of the array row input/outputs that comprise the combination.

5. The method according to claim 4, wherein the passive element is a diode.

6. The method according to claim 1, wherein the array further has a number of keys, switches and columns and the keys are coupled to the switches, wherein the switches are coupled to the rows in the set of rows, the non-set rows and columns.

7. The method according to claim 6, further comprising the step of, in response to at least one of the keys being activated, selectively transitioning the rows in the set of rows and the non-set rows between low and high states and transitioning the columns between low and high input states to determine which key has been activated.

8. An array having a reduced number of input/outputs, comprising:
   at least one column; and
   at least one set of rows for each array row input/output, wherein said set of rows are coupled to said array row input/outputs and a predetermined number of said array row input/outputs form combinations, wherein if non-set rows are added to the array, said non-set rows are coupled to the array row input/outputs that comprise said combinations;
   wherein at least a portion of a number of rows for the array is equal to the number of rows in each set of rows multiplied by the number of array row input/outputs plus the number of non-set rows coupled to the array row input/output combinations.

9. The array according to claim 8, wherein each said set of rows includes a first row and a second row and the array further comprises at least one passive element positioned between said second row and said array row input/output.

10. The array according to claim 9, wherein said passive element is a diode.

11. The array according to claim 1, further comprising a passive element positioned between each said non-set row and each of said array row input/outputs that comprise said combination.

12. The array according to claim 11, wherein said passive element is a diode.

13. The array according to claim 1, further comprising at least one switch, wherein said switches are associated with corresponding keys and said switches are coupled to said rows in said set of rows, said non-set rows and said columns.

14. The array according to claim 13, wherein said array is part of a system having a processor and said array input/outputs are coupled to said processor, wherein said processor, in response to at least one said key being activated, selectively transitions said rows in said set of rows and said non-set rows between low and high states and said columns between input low and high states to determine which said key has been activated.

* * * * *